(12) United States Patent
Schulte et al.

(10) Patent No.: US 6,512,284 B2
(45) Date of Patent: Jan. 28, 2003

(54) THINFILM FUSE/ANTIFUSE DEVICE AND USE OF SAME IN PRINTHEAD

(75) Inventors: Donald W. Schulte, Corvallis, OR (US); Galen H. Kawamoto, Corvallis, OR (US); Deepika Sharma, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/300,793

(22) Filed: Apr. 27, 1999

(65) Prior Publication Data

US 2002/0060350 A1 May 23, 2002

(51) Int. Cl.$^7$ ................................................ H01L 29/00
(52) U.S. Cl. .................... 257/530; 257/50; 257/209; 438/131; 438/467; 438/600; 347/59; 347/62; 347/64
(58) Field of Search ................... 257/209, 530, 257/665, 229, 50; 438/131, 467, 600; 347/59, 62, 64

(56) References Cited

U.S. PATENT DOCUMENTS

| | | | | |
|---|---|---|---|---|
| 5,120,679 A | * | 6/1992 | Boardman et al. | 438/600 |
| 5,134,457 A | * | 7/1992 | Hamdy et al. | 257/530 |
| 5,296,726 A | * | 3/1994 | MacElwee | 257/213 |
| 5,304,508 A | * | 4/1994 | Cohen | 438/467 |
| 5,404,029 A | * | 4/1995 | Husher et al. | 257/50 |
| 5,416,355 A | * | 5/1995 | Kudoh | 257/529 |
| 5,482,884 A | | 1/1996 | McCollum et al. | 438/600 |
| 5,508,220 A | | 4/1996 | Eltoukhy et al. | 438/600 |
| 5,565,702 A | | 10/1996 | Tamura et al. | 257/530 |
| 5,572,050 A | * | 11/1996 | Cohen | 257/209 |
| 5,635,968 A | * | 6/1997 | Bhaskar et al. | 347/59 |
| 5,652,169 A | | 7/1997 | Jun | 438/600 |
| 5,682,059 A | * | 10/1997 | Yoshii et al. | 257/530 |
| 5,847,441 A | * | 12/1998 | Cutter et al. | 257/530 |
| 5,866,938 A | * | 2/1999 | Takagi et al. | 257/530 |
| 5,917,229 A | * | 6/1999 | Nathan et al. | 257/529 |
| 6,065,823 A | * | 5/2000 | Kawamura | 347/18 |
| 6,078,091 A | * | 6/2000 | MacPherson et al. | 257/529 |

OTHER PUBLICATIONS

Chen, "A conductive channel size comparison of silicon dielectric and amorphous silicon antifuses", VLSI Technology, Systems, and Applications. Proceedings of Technical Papers, 1993, pp. 165–167.*

* cited by examiner

Primary Examiner—Eddie Lee
Assistant Examiner—José R. Diaz

(57) ABSTRACT

A semiconductor antifuse device that utilizes a resistive heating element as both a heating source or fuse blowing and as part of the fuse link. The antifuse device may also be utilized as a fuse and the antifuse or fuse embodiment can be programmed and read with the same two electrodes. The antifuse or fuse is well suited for use and efficient fabrication in a printhead apparatus or other circuit arrangements.

16 Claims, 2 Drawing Sheets

THINFILM FUSE/ANTIFUSE DEVICE AND USE OF SAME IN PRINTHEAD

FIELD OF THE INVENTION

The present invention relates to semiconductor fuses and antifuses and, more specifically, to an improved antifuse.

BACKGROUND OF THE INVENTION

Various semiconductor fuses and antifuses are known in the art. These devices, particularly fuses, are typically used to store data. Conventional fuses operate such that they have a low resistance when initially fabricated and a dramatically increased resistance by application of a sufficient pulse of energy to cause the fuse to fail. This type of technology is often used, for example, in programmable read-only memory (PROM) devices. The programming is achieved by applying a sufficient current to desired ones of the fuses to cause those fuses to fail, thus permanently storing data, e.g., blown fuse=1, closed fuse=0.

In contrast to fuses (which have low resistance in an initial state), antifuses typically have a larger resistance in an initial state and less resistance in a "blown" or activated state. Antifuses are also used for data storage. One prior art antifuse structure is that of ACTEL and this structure consists of a thin oxide/nitride/oxide (ONO) layer sandwiched between a heavily doped n+ diffused region and a heavily doped n+ polysilicon electrode. The presence of the ONO layer isolates the electrodes and thus the structure has a large resistance as fabricated. By applying a sufficiently large voltage pulse to this structure, the ONO dielectric will break down leading to a large current flow through the dielectric. This in turn causes localized heating and the resultant formation of a short between the electrodes. Once this short has formed, the resistance of the structure typically drops from greater than 10,000 Ohms to approximately 100 Ohms, depending on the current allowed to flow during the fuse programming.

Another prior art antifuse is disclosed in U.S. Pat. No. 5,572,050 issued to Cohen. This antifuse includes a heating element beneath a pair of electrodes separated by a thermally transformable dielectric material. Applying current to the heating element causes the transformable dielectric to melt and break down which permits formation of a permanent link that programs the antifuse.

Both of the above described antifuse structures rely on a dielectric material between the electrodes to provide an initial resistance value. Dielectric antifuse embodiments are disadvantageous, amongst other reasons, in that they require at least four electrodes, two to program and two to read. A need exists for an antifuse that requires fewer electrodes.

Another disadvantageous aspect of prior art antifuses is that when used with other circuitry (i.e., fabricated on the same die), the dielectric-based antifuse requires significant additional processing, including deposition (or growth) of appropriate dielectric material. A need thus exists for a semiconductor fuse/antifuse that can be manufactured in an efficient manner.

Yet another disadvantageous aspect of prior art antifuses is that they require a significantly large programming signal. A lower power signal for programming and reading are advantages in that they lead to reduced physical stress and more efficient energy use.

Needs also exist for a fuse or antifuse device that has enhanced structural integrity (i.e., it can withstand thermal stress, corrosive ink and other deleterious forces) and a fuse or antifuse that has tri-state properties.

SUMMARY OF THE INVENTION

Accordingly, it is an object of the present invention to provide a semiconductor fuse or antifuse that is programmable and readable with the same two electrodes.

It is another object of the present invention to provide a semiconductor fuse/antifuse with enhanced structural integrity.

It is another object of the present invention to provide such a semiconductor fuse/antifuse that can be used and efficiently fabricated in a printhead environment.

It is another object of the present invention to provide a tri-state fuse/antifuse device.

And it is yet another object of the present invention to provide a low power fuse/antifuse device.

These and related objects of the present invention are achieved by use of a semiconductor antifuse device as described herein.

The attainment of the foregoing and related advantages and features of the invention should be more readily apparent to those skilled in the art, after review of the following more detailed description of the invention taken together with the drawings.

DETAILED DESCRIPTION

Figure 1:
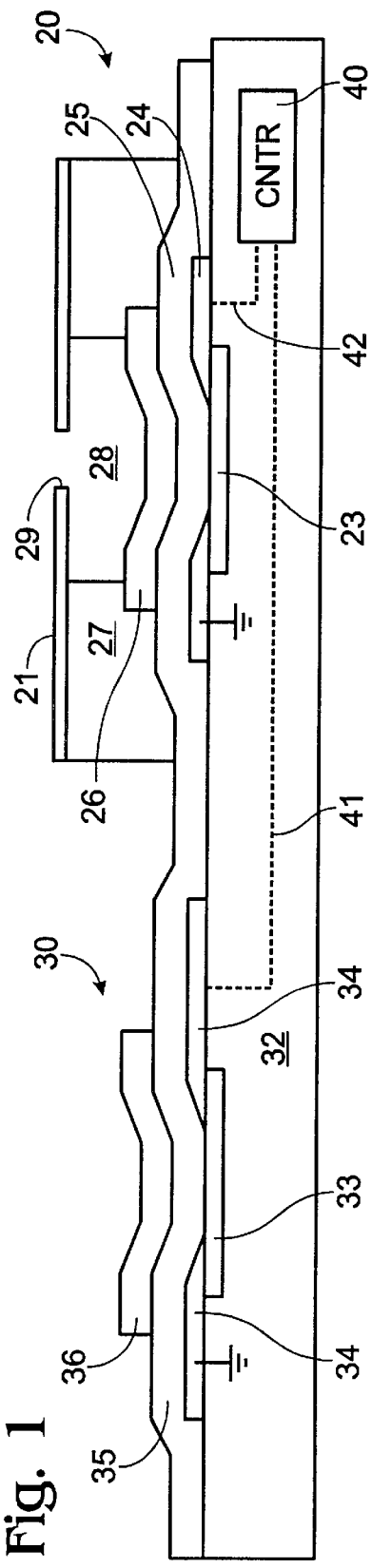
FIG. 1 is a diagram of a semiconductor antifuse in accordance with the present invention.

Referring to FIG. 1, a diagram of a semiconductor antifuse 30 in accordance with the present invention is shown. A firing chamber 20 is also shown fabricated on the same substrate as antifuse 30. Antifuse 30 can be fabricated alone, with a firing chamber or with another circuit or device without departing from the present invention.

Antifuse 30 preferably includes a semiconductive or like substrate 32, a resistive fuse element 33, electrodes 34, a passivation or other insulation layer 35 and a conductive a protection layer 36. The resistive fuse element 33 is preferably a resisitive heating type element similar to the resistive heating element used in ink jet print head and is generally referred to in the following description as "resistive element 33." As discussed in more detail below conductive layer 36 provides both protection for resistive element 33 (by increasing the structural integrity of insulation layer 35, for example, for a fuse as discussed with reference to FIG. 3) and conduction for a blown or "active" antifuse. Since conductive layer 36 provides conduction (short circuit) for antifuse 30 (see FIG. 2), the function of the antifuse is unaffected by ink leakage because leaked ink also causes a short circuit.

Figure 2:
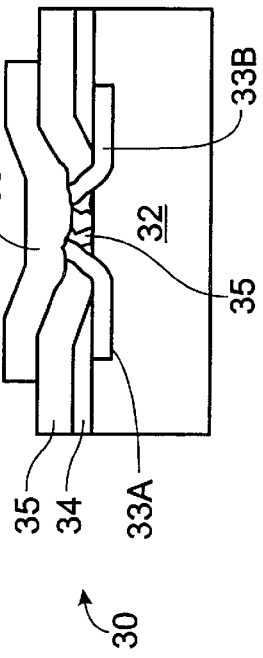
FIG. 2 is a side view of the antifuse in a blown state in accordance with the present invention.

Referring to FIG. 2, a side view of antifuse 30 in a blown state in accordance with the present invention is shown. When an appropriate current is propagated through resistive element 33 and electrode 34, the resistive element will blow.

Empirical evidence indicates that the remaining portions 33A,33B of resistive element 33 will spall and melt generally as shown. The passivation layer 35 may be melted and deformed and the surrounding thin film layers may be cracked or have other stress damage. Upon exposure to sufficient current, the resistive element portions 33A,33B and passivation layer 35 and conductive layer 36 deform sufficiently such that portions 33A,33B contact the conductive layer forming a low resistance path between the electrodes.

The initial resistance across the electrodes in FIG. 1 may be less than approximately 1000 ohms and may further be in the range of approximately 50–200 Ohms, depending on the design parameters of the resistive element. The resistance across the electrodes in FIG. 2, however, may be in the order of 5–20 Ohms. For an embodiment with tantalum (Ta) as the conductive overlayer, a resistance reduction on the order of approximately 5 to 10× is typical. Larger reductions should be possible if a lower resistance metal overlayer, such as Au or Al or the like, is used.

Figure 3:
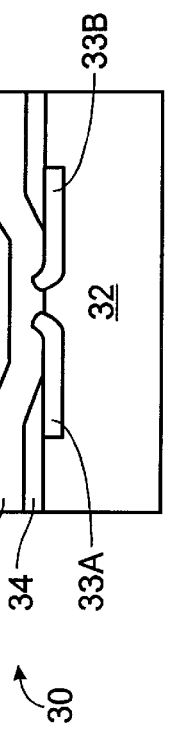
FIG. 3 is a side view of a partially blown (or tri-state) configuration of the antifuse in accordance with the present invention.

Referring to FIG. 3, a side view of a partially blown (or tri-state) configuration of antifuse 30 in accordance with the present invention is shown. In the illustration of FIG. 3, a sufficient current is passed through resistive element 33 to blow the resistive element. The current amount, however, is less than that used in FIG. 2 and is sufficient to cause breakage of the resistive element, but not sufficient enough to cause a deformation of the resistive element, passivation layer and conductive layer such that a signal path through the conductive layer is formed. The device of FIG. 3 has a high resistance like a blown fuse. Accordingly, antifuse 30 can be transformed from an initial resistance level to a low resistance level or to a high resistance level, depending on the applied programming current.

Referring again to FIG. 1, antifuse 30 may be advantageously used and fabricated in a printhead arrangement (and in other circuit environments). Firing chamber 20 preferably includes resistive element 23, electrodes 24, passivation or insulation layer 25, conductive protection layer 26, barrier level 27, ink well 28, nozzle 29 and nozzle plate 21. Firing chambers are known in the art. Antifuse 30 can be efficiently and advantageously used with firing chamber 20 and the like because several components of each device can be formed during the same process steps. For example, resistive elements 33,23, electrodes 34,24, passivation or insulation layers 35,25, and conductive protection layers 36,26 may be formed in corresponding process steps. These paired components would thus be formed of substantially the same material.

FIG. 1 also illustrates control logic 40 that propagates firing signals over line 42 to firing chamber 20 and programming and/or read signals over line 41 to antifuse 30.

With respect to programming pulses and component configuration, in a preferred embodiment, application of a 5V, one ms pulse is sufficient for link formation, i.e., antifuse activation, on resistive element widths from 2.5 to 5 um and lengths from 5 to 10 um. For resistive elements with 5 um length, this results in programming current from approximately 60–120 mA as width increases from 2.5 to 5 um. Programming currents for resistive elements with 10 um length will be approximately half this. Programming of the low resistance state will be more reliable when voltages and currents larger than those discussed immediately above are used for link formation. Programming of the high resistance state will require voltages (or current) that are approximately 50% lower than those discussed above and the use of longer programming pulses. It should be recognized that the actual programming current (time and magnitude, etc.) will vary with process, component size and characteristic resistivity of material used, etc., as would be apparent to one skilled in the art.

For rectangular resistive elements with L/W>1, the programming current will be proportional to the resistive element width W. Reduction in programming current can be obtained by using pinch point designs or other geometric features designed to reduce programming current, for example, those discussed below with reference to FIGS. 4–6. As with all thermal structures, the exact programming currents needed for a given design will depend upon (1) the thickness of the passivation and conductive layers (e.g., as the thermal mass of the structure increases, heat dissipation increases and thus more energy is required to heat the structure to a given temperature) and (2) the geometry of the resistive element itself.

With respect to the thicknesses of the layers of antifuse 30, the thicknesses may vary based on intended design and on improvements in processing techniques. Nonetheless, general thickness consideration include the following: Ta conductive layer 3000–6000 Å (will probably depend on desired value of low resistant link and materials used); passivation layer 3750–7500 Å (1000Å to 1 um with a nominal value of 4000 Å); electrode thickness (Al) 5000 Å (may depend on desired interconnect resistance); and resistive element thickness approximately 1000 Å (will vary with resistive element material and desired resistance). The resistive element 33 (and the resistive element 23 of FIG. 1) may be formed of any suitable resistive layer material. Suitable resistive layer material typically includes one or more metals and examples include, but are not limited to, aluminum, tantalum containing material (e.g., TaN, TaAl, TaAlO$_x$) and HfB$_2$, etc., as is known in the art.

Figure 4:
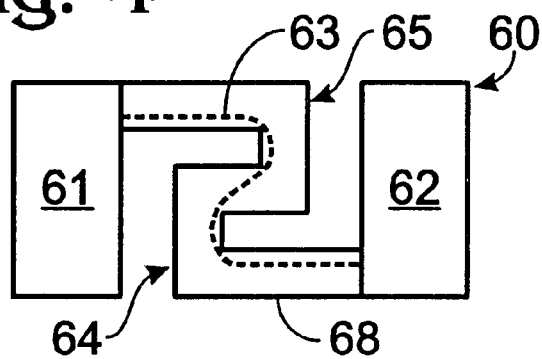
FIGS. 4–6 are various embodiments of fused geometries in accordance with the present invention.
Figure 5:
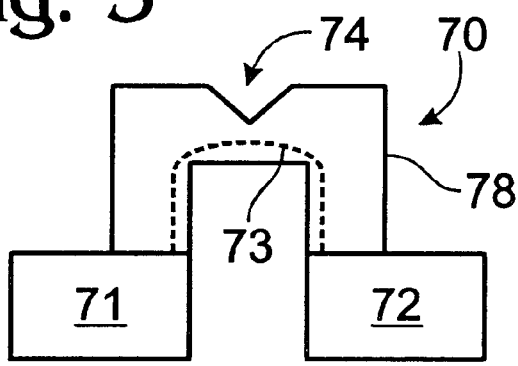
Figure 6:
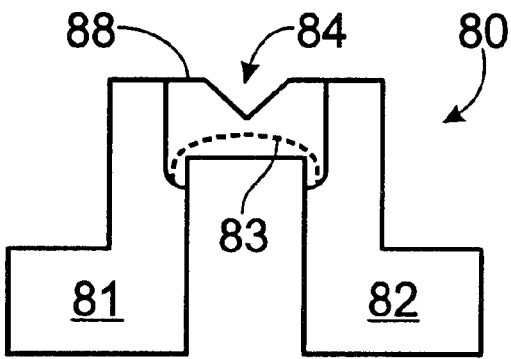

Referring to FIGS. 4–6, various embodiments of fuse/antifuse geometries in accordance with the present invention are shown. These fuses 60, 70, 80, have geometries that channel programming current to "hot spots" and thus reduce the programming energy required to blow the fuse. FIG. 4 illustrates a meander shaped resistive element 68 coupled between two electrodes 61,62. The meander bends 64, 65 are likely spots of fuse rupture. Dashed line 63 represents current flow which is concentrated at the bends adding to heat generation and rupture.

FIGS. 5 and 6 illustrate other fuse/antifuse geometries that take advantage of current crowding effects. These fuses or antifuses 70,80 include a "U" or "M" shaped region that at least in part include a channeled resistive element 78,88.

The curve of the U or M provides the meander current crowding effect discussed above. In addition, regions 74, 84 are configured to form a channel (generally centered in the bend) that further increases current crowding and thus results in more rapid and efficient fuse breakdown. FIG. 5 also shows electrodes 71,72 and current path 73, while FIG. 6 similarly shows electrodes 81,82 and current path 83.

The fuse geometries of FIGS. 4–6 may be used in antifuse 30.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. A thinfilm device for providing a fuse/antifuse function, comprising:
    a semiconductor substrate;
    a resistive fuse element formed on said substrate;
    a first electrode and a second electrode formed on said substrate and electrically coupled to said resistive fuse element, said resistive fuse element creating a first resistance between said electrodes in an initial state;
    an insulation layer provided over said first and second electrodes and said resistive fuse element; and
    a conductive material formed on said insulation layer and aligned with said resistive fuse element;
    wherein said device is fabricated without an ink well formed over said conductive material; and further
    wherein a first conductive path is provided in said substrate to said first electrode and a second conductive path is provided in said substrate to said second electrode, said first and second conductive paths being adapted for propagation of signals for both programming and reading the resistive fuse element via said first and second electrodes.

2. The device of claim 1, further including control logic in said substrate that is capable of both programming and reading said resistive fuse element.

3. The device of claim 1, wherein said first resistance is less than approximately 1000 ohms.

4. The device of claim 1, further comprising a firing chamber provided on said substrate that includes an ink expelling resistive element, and said ink expelling resistive element and said resistive fuse element are formed of the same material.

5. The device of claim 1, further comprising a firing chamber formed on said semiconductor substrate.

6. The device of claim 5, wherein said firing chamber includes an ink well and a conductive protection layer formed under that ink well, and the conductive protection layer formed under said ink well and the conductive material formed over said resistive fuse element are formed of the same material.

7. The apparatus of claim 1, wherein said resistive fuse element is disposed between said first and second electrodes and formed in a principal plane, said resistive fuse element having a cross-sectional area in a plane generally perpendicular to said principal plane that is constricted relative to the cross-sectional area of the resistive fuse element in a plane parallel to the perpendicular plane where the resistive fuse element contacts the first or the second electrode.

8. A thinfilm fuse/antifuse device, comprising:
    a semiconductor substrate;
    a first portion of a resistive fuse element;
    a second portion of a resistive fuse element;
    insulation material provided over said first and second portions of said resistive fuse element;
    conductive material formed over said insulation material in a manner without an ink well formed thereon;
    a first conductive path provided in said substrate to said first portion of said resistive fuse element and a second conductive path provided in said substrate to said second portion of said resistive fuse element, said first and second conductive paths being adapted for propagation of signals for both programming and reading the fuse state achieved by the first and second portions of the resistive fuse element; and
    wherein said first and second portions are formed by providing a current through a singular resistive fuse element which ruptures that singular resistive fuse element into at least said first and second portions; and further
    wherein at least one of said portions terminates in said insulation material such that that portion does not contact said conductive material.

9. The device of claim 8, further comprising a firing chamber provided on said substrate that includes an ink well and an ink expelling resistive element, and wherein said ink expelling resistive element and said first and second portions of the resistive fuse element are formed of the same material.

10. A thinfilm fuse/antifuse apparatus, comprising:
    a substrate;
    a first portion of a resistive fuse element;
    a second portion of a resistive fuse element;
    insulation material provided over said first and second portions of said resistive fuse element;
    conductive material formed over said insulation material in a manner without an ink well formed thereon;
    a first conductive path provided in said substrate to said first portion of said resistive fuse element and a second conductive path provided in said substrate to said second portion of said resistive fuse element, said first and second conductive paths being adapted for propagation of signals for both programming and reading the fuse state achieved by the first and second portions of the resistive fuse element; and
    wherein said first and second portions are formed by providing a current through a singular resistive fuse element which ruptures that singular resistive fuse element into at least said first and second portions; and further
    wherein both of said first and second portions are electrically coupled through said insulation material to the conductive material.

11. The apparatus of claim 10, further comprising control logic coupled to said first and second conductive paths that both programs and reads the fuse state achieved by said first and second portions of said resistive fuse element.

12. The apparatus of claim 10, further comprising a firing chamber that includes a resistive heating element, and the resistive heating element of the firing chamber and the first and second portions of the resistive fuse elements are formed of the same material.

13. The apparatus of claim 12, wherein said firing chamber includes a passivation layer and said passivation layer and said insulation material are formed of the same material.

14. A thinfilm device for providing a fuse/antifuse function, comprising:
    a semiconductor substrate;
    a resistive fuse element formed on said substrate;
    a first electrode and a second electrode formed on said substrate and electrically coupled to said resistive fuse element, said resistive fuse element creating a first resistance between said electrodes in an initial state;
    an insulation layer provided over said first and second electrodes and said resistive fuse element; and
    a conductive material formed on said insulation layer and aligned with said resistive fuse element;

wherein said resistive fuse element has a length and is disposed between said first and second electrodes substantially in a first plane, said fuse element being further configured to have a bend along its length and substantially in said first plane that causes current passing through said resistive fuse element to be more concentrated than where said resistive fuse element contacts said first or second electrode.

15. The device of claim 14, wherein said bend is of substantially 45 degrees or greater.

16. A thinfilm device for providing a fuse/antifuse function, comprising:

a semiconductor substrate;

a resistive fuse element formed on said substrate;

a first electrode and a second electrode formed on said substrate and electrically coupled to said resistive fuse element, said resistive fuse element creating a first resistance between said electrodes in an initial state;

an insulation layer provided over said first and second electrodes and said resistive fuse element; and a conductive material formed on said insulation layer and aligned with said resistive fuse element;

wherein said resistive fuse element is disposed between said first and second electrodes and formed in a principal plane, said resistive fuse element having a cross-sectional area in a plane perpendicular to said principal plane that is constricted relative to the cross-sectional area of the resistive fuse element in a plane parallel to the perpendicular plane where the resistive fuse element contacts the first or the second electrode.

* * * * *